(12) United States Patent
Li et al.

(10) Patent No.: US 8,513,967 B2
(45) Date of Patent: Aug. 20, 2013

(54) MANIPULATOR OF ROBOT

(75) Inventors: Shen-Chun Li, Taipei Hsien (TW); Hsien-Chuan Liang, Taipei Hsien (TW); Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 461 days.

(21) Appl. No.: 12/884,210

(22) Filed: Sep. 17, 2010

(65) Prior Publication Data
US 2011/0316570 A1    Dec. 29, 2011

(30) Foreign Application Priority Data
Jun. 29, 2010  (TW) ................................ 99121176 A

(51) Int. Cl.
*G01R 31/02*  (2006.01)
(52) U.S. Cl.
USPC ................ 324/754.03; 324/765.01; 324/72.5; 324/750.16

(58) Field of Classification Search
USPC ................. 324/765.01, 754.03, 72.5, 750.16; 269/53
See application file for complete search history.

(56) References Cited

U.S. PATENT DOCUMENTS

| | | | |
|---|---|---|---|
| 5,538,305 A * | 7/1996 | Conway et al. | 294/119.1 |
| 7,091,730 B1 * | 8/2006 | Parshotam et al. | 324/750.22 |

\* cited by examiner

*Primary Examiner* — Arleen M Vazquez
*Assistant Examiner* — Son Le
(74) *Attorney, Agent, or Firm* — Altis Law Group, Inc.

(57) ABSTRACT

An exemplary manipulator of a robot includes a detecting bar including two detecting pins and a regulating mechanism for regulating the distance between the two detecting pins, a fastening seat supporting the detecting bar, a fixing device fixed to the fastening seat, a driving mechanism disposed on the fastening seat, and an adjusting element connecting the driving mechanism with the regulating mechanism of the detecting bar. Under a driving action of the driving mechanism on the adjusting element, the adjusting element rotates to cause the regulating mechanism of the detecting bar to regulate the distance between the two detecting pins.

14 Claims, 4 Drawing Sheets

MANIPULATOR OF ROBOT

BACKGROUND

1. Technical Field

The disclosure relates to manipulators of robots.

2. Description of Related Art

Manipulators of robots are widely used in product test procedures as a substitute for manual work. For example, in a procedure for testing a printed circuit board (PCB), the manipulator having a pair of detecting pins respectively used as an anode and a cathode moves along three axes of a three-dimensional coordinate system to precisely contact pairs of electrical nodes on the PCB and test for whether bad electrical connections of the electrical nodes exist or not. However, since the distances between the pairs of the electrical nodes on the PCB are different from each other, the distance between the two detecting pins needs to be regulated. This is typically done by a human operator using a hand tool such as a wrench. The wrench is used to twist a portion of the manipulator. Thus the task of making the detecting pins align with the electrical nodes on the PCB is time consuming and adds to costs.

What is needed, therefore, is a manipulator of a robot which can overcome the limitations described.

DETAILED DESCRIPTION

Figure 1:
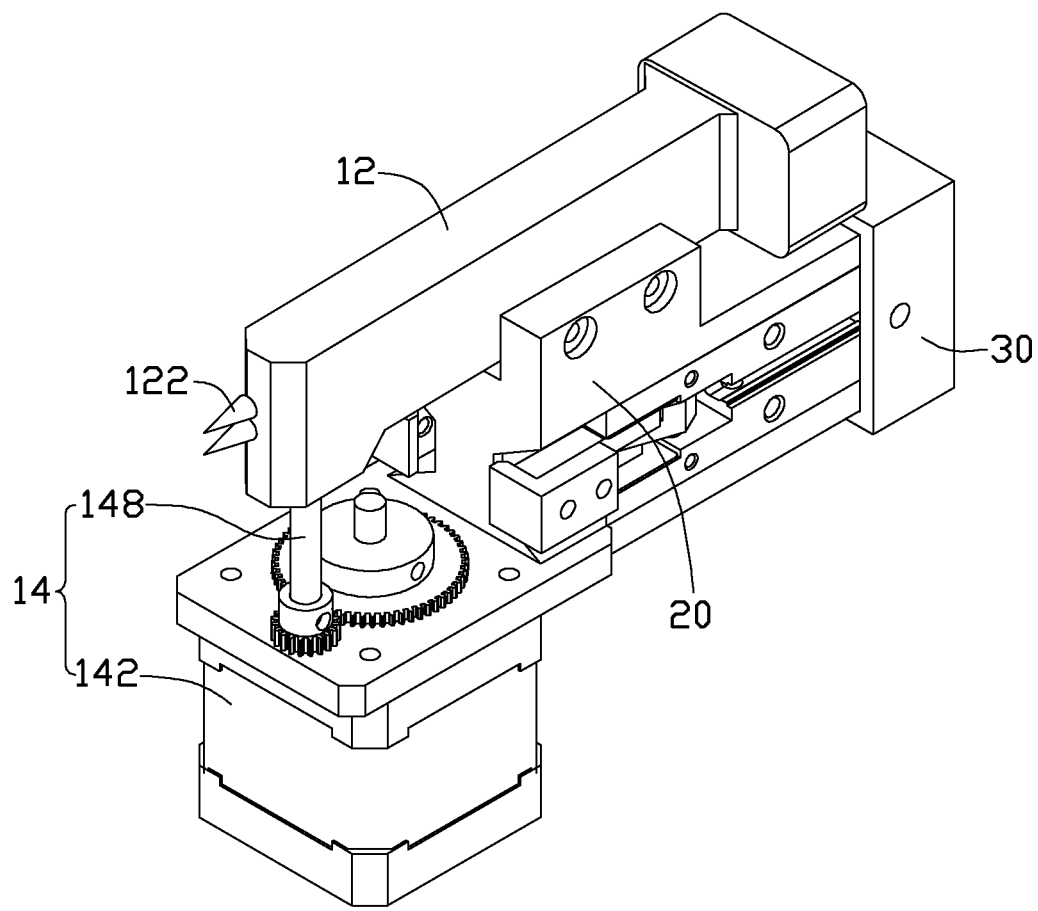
FIG. 1 is an assembled, isometric view of a manipulator of a robot in accordance with an embodiment of the disclosure.
Figure 4:
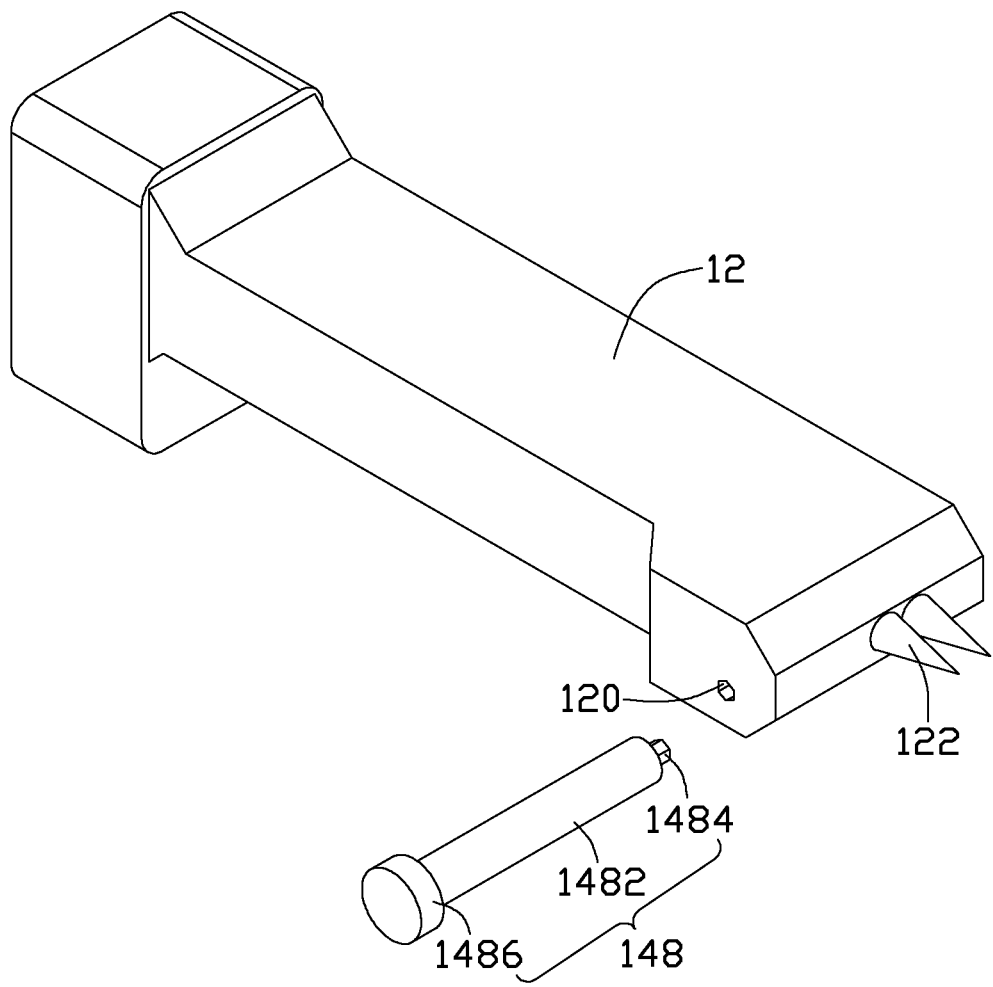
FIG. 4 is an enlarged, isometric view of a detecting bar and an adjusting element of the manipulator of FIG. 2, showing them inverted.

Referring to FIGS. 1 and 4, a manipulator of a robot in accordance with an embodiment is shown. The manipulator includes a detecting bar 12, a fastening seat 20 supporting the detecting bar 12, a driving device 14 fastened on the fastening seat 20, and a fixing device 30 fixed to the fastening seat 20. The detecting bar 12 includes two detecting pins 122 respectively used as an anode and a cathode for precisely contacting pairs of electrical nodes on a printed circuit board (not shown) and detecting whether bad electrical connections between the electrical nodes exist or not. A regulating mechanism 120 is provided at one end of the detecting bar 12 for regulating the distance between the two detecting pins 122. An inner wall of the regulating mechanism 120 has a cross section of a hexagon. In the present embodiment, the detecting bar 12 having the regulating mechanism 120 is a piece of equipment known in the art and available commercially.

Figure 2:
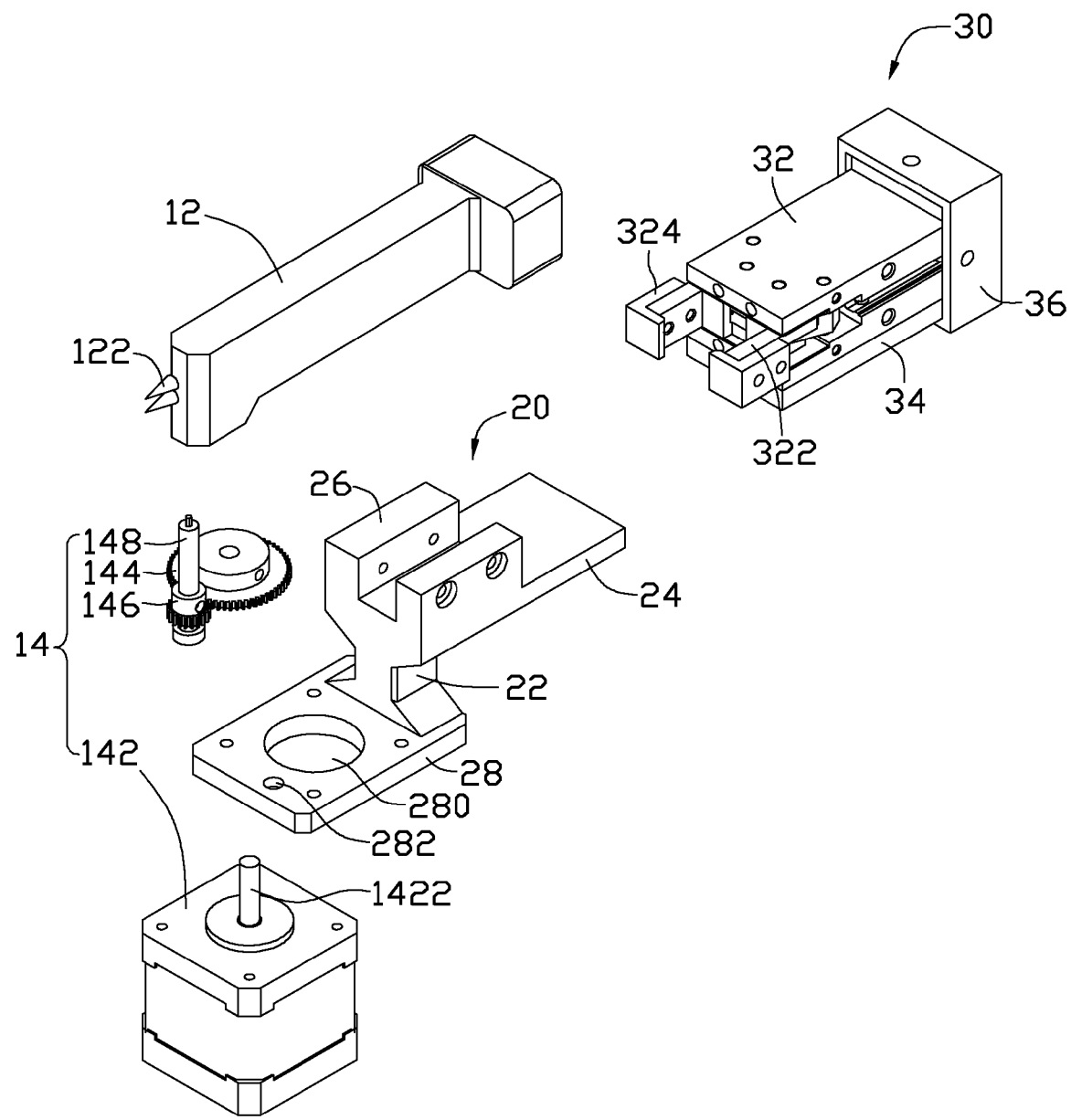
FIGS. 2-3 are exploded views of the manipulator of FIG. 1.
Figure 3:
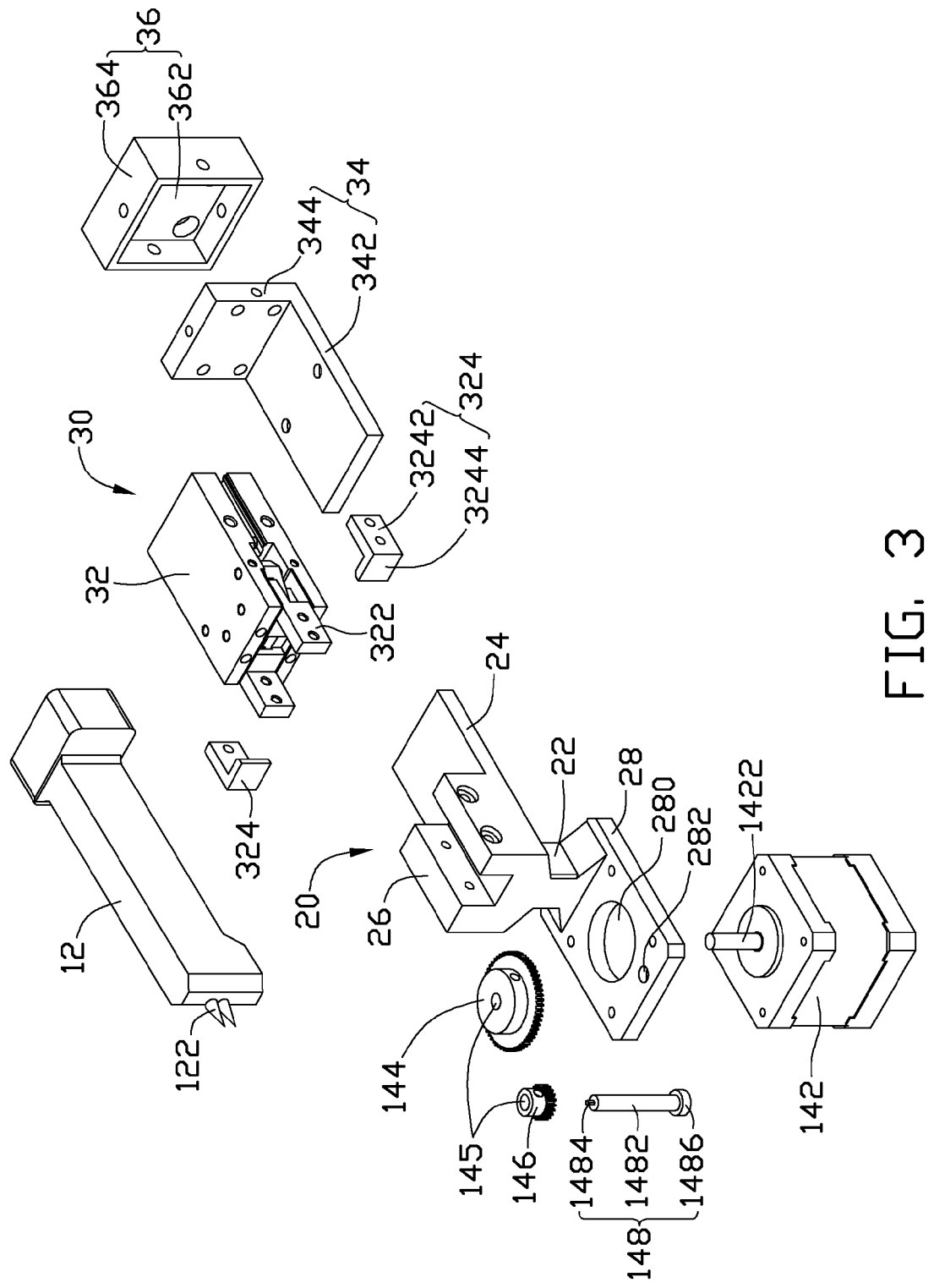

Also referring to FIGS. 2-3, the driving device 14 includes a driving mechanism disposed on the fastening seat 20, and an adjusting element 148 connecting the driving mechanism with the regulating mechanism 120 of the detecting bar 12. The driving mechanism includes a stepping motor 142 and a speed reducer. The stepping motor 142 includes a rotating shaft 1422. The speed reducer includes an active gear 144 and a passive gear 146, wherein the number of teeth of the active gear 144 is greater than that of the passive gear 146.

The active gear 144 and the passive gear 146 each define a circular through hole 145 in a center thereof. The adjusting element 148 includes a cylindrical pole 1482, a twisting portion 1484 extending from an end of the pole 1482, and a baffle portion 1486 extending from another end of the pole 1482. The twisting portion 1484 also has a cross section of a hexagon, for engaging with the regulating mechanism 120 of the detecting bar 12. The baffle portion 1486 has a diameter larger than that of the pole 1482.

The fastening seat 20 is integrally (monolithically) formed as a single body of the same material. The fastening seat 20 includes a neck 22, a supporting plate 24 located at a side of the neck 22, two sandwiching plates 26 extending from a top face of the supporting plate 24, and a holding plate 28 located at another opposite side of the neck 22. The holding plate 28 of the fastening seat 20 defines a circular first through hole 280 in a center thereof, and a second through hole 282 near the first through hole 280.

The fixing device 30 includes a sandwiching mechanism 32, a fastening mechanism 34 fastening the sandwiching mechanism 32 thereon, and a connecting mechanism 36 connecting the fastening mechanism 32. The connecting mechanism 36 is adapted for fastening the manipulator on a robot arm (not shown). The sandwiching mechanism 32 includes two sandwiching claws 322 at an end. Two claw portions 324 are respectively fastened on the two sandwiching claws 322. The claw portions 324 each include a side plate 3242, and a bending plate 3244 perpendicular to the side plate 3242. The fastening mechanism 34 includes a horizontal plate 342, and a vertical plate 344 extending vertically upwardly from an end of the horizontal plate 342. The connecting mechanism 36 includes a connecting plate 362 and four side walls 364 extending from a side of the connecting plate 362, whereby the connecting plate 362 and the side walls 364 cooperatively form a receiving space (not labeled). The robot arm is connected to another side of the connecting plate 362.

In assembly, the detecting bar 12 is disposed on the top face of the supporting plate 24 of the fastening seat 20 and fastened between the two sandwiching plates 26. The sandwiching mechanism 32 is fastened on the horizontal plate 342 of the fastening mechanism 34, and the neck 22 of the fastening seat 20 is sandwiched between the two sandwiching claws 322 of the sandwiching mechanism 32. The vertical plate 344 of the fastening mechanism 34 is received in the receiving space of the connecting mechanism 36 and fastened on the connecting plate 362. The pole 1482 of the adjusting element 148 extends through the second through hole 282 of the holding plate 28 and the through hole 145 of the passive gear 146, and is fastened on the passive gear 146. The baffle portion 1486 of the adjusting element 148 abuts against the bottom of the holding plate 28. The twisting portion 1484 of the adjusting element 148 engages with the regulating mechanism 120 of the detecting bar 12. The active gear 144 is placed on the holding plate 28 of the fastening seat 20 and meshes with the passive gear 146. The stepping motor 142 is secured on the bottom of the holding plate 28. The rotating shaft 1422 of the stepping motor 142 extends through the first through hole 280 of the holding plate 28 and the through hole 145 of the active gear 144, and is fastened on the active gear 144.

In use, the manipulator is connected to the robot arm via the connecting mechanism 36. Under control of predetermined programs, the stepping motor 142 runs to cause the active gear 144 to rotate, and the active gear 144 causes the passive gear 146 and the adjusting element 148 to rotate. With the adjusting element 148 rotating, the adjusting element 148 twists the regulating mechanism 120 of the detecting bar 12 to cause one of the detecting pins 122 to move towards or away from another detecting pin 122, so that the detecting pins 122 can precisely align with and contact pairs of the electrical nodes on the printed circuit board and speedily detect whether bad electrical connections of the electrical nodes exist or not.

According to the disclosure, under the action of the driving mechanism on the adjusting element 148, the regulating mechanism 120 of the detecting bar 12 rotates to automatically regulate the distance between the two detecting pins 122. Thereby, the manipulator allows speedy detection of whether bad electrical connections of the electrical nodes exist or not.

It is to be understood, however, that even though numerous characteristics and advantages of the embodiment have been set forth in the foregoing description, together with details of the structures and functions of the embodiment, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A manipulator of a robot, the manipulator comprising:
a detecting bar comprising two detecting pins and a regulating mechanism for regulating the distance between the two detecting pins;
a fastening seat supporting the detecting bar, the fastening seat comprising a neck, a supporting plate located at a side of the neck, two sandwiching plates extending from the supporting plate, and a holding plate located at another opposite side of the neck, the detecting bar being fastened between the two sandwiching plates;
a fixing device fixed to the fastening seat, the neck of the fastening seat being fastened on the fixing device;
a driving mechanism disposed on the fastening seat, the driving mechanism comprising a stepping motor fastened on the holding plate of the fastening seat; and
an adjusting element connecting the driving mechanism with the regulating mechanism of the detecting bar;
wherein under a driving action of the driving mechanism on the adjusting element, the adjusting element rotates to cause the regulating mechanism of the detecting bar to regulate the distance between the two detecting pins.

2. The manipulator of claim 1, wherein the driving mechanism further comprises a speed reducer connected between the stepping motor and the adjusting element.

3. The manipulator of claim 2, wherein the speed reducer comprises an active gear and a passive gear meshing with the active gear, the stepping motor comprising a rotating shaft, the active gear being fastened on the rotating shaft of the stepping motor, and the passive gear being fastened on the adjusting element.

4. The manipulator of claim 3, wherein the holding plate of the fastening seat defines a through hole, the adjusting element comprising a cylindrical pole, a twisting portion extending from an end of the pole, and a baffle portion extending from another end of the pole, the pole of the adjusting element extending through the through hole of the holding plate and being fastened on the passive gear, the baffle portion of the adjusting element abutting against the holding plate, and the twisting portion of the adjusting element engaging with the regulating mechanism of the detecting bar.

5. The manipulator of claim 1, wherein the holding plate of the fastening seat defines a through hole, the adjusting element comprising a cylindrical pole, a twisting portion extending from an end of the pole, and a baffle portion extending from another end of the pole, the pole of the adjusting element extending through the through hole of the holding plate and being fastened on the passive gear, the baffle portion of the adjusting element abutting against the holding plate, and the twisting portion of the adjusting element engaging with the regulating mechanism of the detecting bar.

6. The manipulator of claim 1, wherein the fixing device comprises a sandwiching mechanism, a fastening mechanism fastening the sandwiching mechanism, and a connecting mechanism connecting the fastening mechanism, the connecting mechanism being adapted for fastening the manipulator on a robot arm, the sandwiching mechanism comprising two sandwiching claws at an end thereof, and the neck of the fastening seat being sandwiched between the two sandwiching claws.

7. The manipulator of claim 6, wherein the fastening mechanism comprises a horizontal plate and a vertical plate extending from an end of the horizontal plate, the connecting mechanism comprises a connecting plate and four side walls extending from a side of the connecting plate, the connecting plate and the side walls cooperatively form a receiving space, the sandwiching mechanism is fastened on the horizontal plate of the fastening mechanism, and the vertical plate of the fastening mechanism is received in the receiving space and fastened on the connecting plate of the connecting mechanism.

8. A manipulator of a robot, the manipulator comprising:
a detecting bar comprising two detecting pins, and a regulating mechanism for regulating the distance between the two detecting pins;
a fastening seat supporting the detecting bar, the fastening seat comprising a neck, a supporting plate located at a side of the neck, two sandwiching plates extending from the supporting plate, and a holding plate located at another opposite side of the neck, the detecting bar being fastened between the two sandwiching plates;
a fixing device fixed to the fastening seat, the neck of the fastening seat being fastened on the fixing device;
a driving mechanism comprising a stepping motor disposed on the holding plate of the fastening seat; and
an adjusting element connecting the driving mechanism with the regulating mechanism of the detecting bar;
wherein when the stepping motor runs, the stepping motor causes the adjusting element to rotate, and the regulating mechanism of the detecting bar is driven by the adjusting element to regulate the distance between the two detecting pins.

9. The manipulator of claim 8, wherein the driving mechanism further comprises a speed reducer connected between the stepping motor and the adjusting element.

10. The manipulator of claim 9, wherein the speed reducer comprises an active gear and a passive gear meshing with the active gear, the stepping motor comprising a rotating shaft, the active gear being fastened on the rotating shaft of the stepping motor, the passive gear being fastened on the adjusting element.

11. The manipulator of claim 10, wherein the holding plate of the fastening seat defines a through hole, the adjusting element comprising a cylindrical pole, a twisting portion extending from an end of the pole and a baffle portion extending from another end of the pole, the pole of the adjusting element extending through the through hole of the holding plate and then being fastened on the passive gear, the baffle portion of the adjusting element abutting against the holding plate, the twisting portion of the adjusting element engaging with the regulating mechanism of the detecting bar.

12. The manipulator of claim 8, wherein the holding plate of the fastening seat defines a through hole, the adjusting element comprising a cylindrical pole, a twisting portion extending from an end of the pole and a baffle portion extending from another end of the pole, the pole of the adjusting element extending through the through hole of the holding plate and then being fastened on the passive gear, the baffle portion of the adjusting element abutting against the holding plate, the twisting portion of the adjusting element engaging with the adjusting portion of the detecting bar.

13. The manipulator of claim 8, wherein the fixing device comprises a sandwiching mechanism, a fastening mechanism fastening the sandwiching mechanism, and a connecting mechanism connecting the fastening mechanism, the connecting mechanism being adapted for fastening the manipulator on a robot arm, the sandwiching mechanism comprising two sandwiching claws at an end, the neck of the fastening seat being sandwiched between the two sandwiching claws.

14. The manipulator of claim 13, wherein the fastening mechanism comprises a horizontal plate and a vertical plate extending from an end of the horizontal plate, the connecting mechanism comprises a connecting plate and four side walls extending from a side of the connecting plate, the connecting plate and the side walls cooperatively form a receiving space, the sandwiching mechanism being fastened on the horizontal plate of the fastening mechanism, the vertical plate of the fastening mechanism being received in the receiving space and fastened on the connecting plate of the connecting mechanism.

* * * * *